United States Patent [19]

Tsai et al.

[11] Patent Number: 5,851,890
[45] Date of Patent: Dec. 22, 1998

[54] PROCESS FOR FORMING INTEGRATED CIRCUIT STRUCTURE WITH METAL SILICIDE CONTACTS USING NOTCHED SIDEWALL SPACER ON GATE ELECTRODE

[75] Inventors: Jiunn-Yann Tsai, San Jose; John Haywood, Santa Clara; Ming Yi Lee, Fremont, all of Calif.

[73] Assignee: LSI Logic Corporation, Milpitas, Calif.

[21] Appl. No.: 919,394

[22] Filed: Aug. 28, 1997

[51] Int. Cl.$^6$ .................................................. H01L 21/335
[52] U.S. Cl. .......................... 438/303; 438/305; 438/592; 438/595; 438/655
[58] Field of Search .................................... 438/233, 303, 438/305, 592, 595, 655, 682, 683, 738, 743, 744; 257/382, 384, 387, 388, 413

[56] References Cited

U.S. PATENT DOCUMENTS

| | | | |
|---|---|---|---|
| 4,151,010 | 4/1979 | Goth | 438/339 |
| 4,735,680 | 4/1988 | Yen | 156/643 |
| 4,912,061 | 3/1990 | Nasr | 438/233 |
| 5,695,602 | 12/1997 | Takeshiro | 156/643.1 |
| 5,739,573 | 4/1998 | Kawaguchi | 257/384 |

OTHER PUBLICATIONS

Fornara, P., et al., "Modeling of Local Reduction in TiSi$_2$ and CoSi$_2$ Growth Near Spacers in MOS Technologies: Influence of Mechanical Stress and Main Diffusing Species", *IEDM*, vol. 96, 1996, pp. 73–76.

Mazuré, Carlos, et al., "Impact of LDD Spacer Reduction on MOSFET Performance for Sub–$\mu$m Gate/Space Pitches", *IEDM*, vol. 92, 1992, pp. 893–896.

*Primary Examiner*—T. N. Quach
*Attorney, Agent, or Firm*—John P. Taylor

[57] ABSTRACT

A process for forming improved metal silicide contacts over the gate electrode and source/drain regions of MOS devices of an integrated circuit structure formed in a silicon substrate is described. The metal silicide contacts are formed by first forming a silicon oxide layer over exposed portions of the silicon substrate and over exposed surfaces of previously formed polysilicon gate electrodes. Silicon nitride sidewall spacers are then formed over the oxide on the sidewalls of the gate electrode by depositing a silicon nitride layer over the entire structure and then anisotropically etching the silicon nitride layer. Source/drain regions are then formed in the silicon substrate adjacent the nitride spacers and the structure is then contacted with an oxide etch to remove oxide from the upper surface of the gate electrode and the substrate surface over the source/drain regions. During the oxide etch step, notches, each having an aspect ratio of 1 or less, are formed in the exposed edges of the oxide respectively between the silicon nitride spacers and either the substrate or the gate electrode. A metal layer capable of reacting with the exposed silicon to form metal silicide contacts is then blanket deposited over the structure and into the notches. After reacting the metal with silicon surfaces with which it is in contact to form metal silicide, the unreacted metal is removed, leaving a metal silicide gate contact on the upper surface of the polysilicon gate electrode, as well as those upper portions of the sidewall of the gate electrode exposed by forming the notch in the oxide layer on the sidewall of the electrode. Metal silicide source/drain contacts of enlarged area are also formed over the exposed silicon surfaces of the source/drain regions and those portions of the silicon substrate beneath the nitride spacers exposed by the notches formed in the oxide beneath the nitride spacers.

16 Claims, 5 Drawing Sheets

PROCESS FOR FORMING INTEGRATED CIRCUIT STRUCTURE WITH METAL SILICIDE CONTACTS USING NOTCHED SIDEWALL SPACER ON GATE ELECTRODE

BACKGROUND OF THE INVENTION

1. Field of the Invention

This invention relates to the formation of integrated circuit structures on semiconductor substrates. More particularly, this invention relates to the formation of improved metal silicide contacts for an integrated circuit structure using notched spacers on the sidewall of gate electrodes.

2. Description of the Related Art

In the formation of MOS devices of integrated circuit structures, insulated spacers are normally formed on the sidewalls of gate electrodes which serve to provide electrical insulation between the gate electrode and the source/drain regions, and also are utilized in the formation of lightly doped drain (LDD) regions between the source/drain regions in the semiconductor substrate and the channel region in the substrate beneath the gate oxide and gate electrode. While both silicon oxide and silicon nitride are known and utilized as insulation materials in the formation of integrated circuit structures, silicon oxide is the material of choice for such insulation spacers because of the stress which would result from the formation of silicon nitride spacers directly over a silicon surface, and the additional steps which would be required to form a sufficiently thick silicon oxide buffer layer (conventional gate oxide is too thin) between the silicon substrate and such silicon nitride spacers to alleviate such stress.

The oxide spacers are normally formed on the sidewalls of gate electrodes by first forming an oxide layer over the entire structure, including the gate electrodes. This oxide layer is then anisotropically etched, for example, with a reactive ion etch (RIE) using $CF_4+CHF_3$, to thereby remove all of the oxide layer except the portions on the sidewall of the gate electrodes, resulting in the prior art structure shown in FIG. 1. As shown in FIG. 1, a semiconductor substrate 2 has a gate oxide portion 4 formed on a part of the surface of substrate 2 with a polysilicon gate electrode 6 formed over gate oxide 4. Oxide spacers 10 and 12 are shown formed on the sidewalls of gate electrode 6 by the anisotropic etch just described. In the structure shown in FIG. 1, lightly doped drain (LDD) regions 20 and 22 are also shown respectively formed in substrate 2 beneath oxide spacers 10 and 12 by lightly doping substrate 2 (either P– or N–, depending upon the substrate conductivity type) prior to the formation of oxide spacers 10 and 12. Source/drain regions 30 and 32 are shown respectively formed adjacent LDD regions 20 and 22 and bounded respectively by oxide spacers 10 and 12, as well as field oxide portions 8. Source/drain regions 30 and 32 are formed by doping the substrate, after formation of oxide spacers 10 and 12, with the same type of dopant used to form the LDD regions, but with a heavier dosage (either P+ or N+).

After forming source/drain regions 30 and 32 in substrate 2, metal silicide contacts are usually formed over gate electrode 6 and source/drain regions 30 and 32 to provide lower resistance surface contacts between overlying filled contact openings (leading to overlying wire harness layers) and the respective silicon source/drain regions and polysilicon gate electrode. These metal silicide contacts are formed by deposition of a layer of a metal capable of reacting with the exposed silicon substrate (the surface of source/drain regions 30 and 32) and the surface of polysilicon gate electrode 6 to form metal silicide. However, to ensure a satisfactory deposition of the metal layer over the exposed silicon surfaces and subsequent reaction between the metal and the silicon surfaces, it is conventional to contact the structure with an oxide etch, such as a 1 vol. % HF solution. This oxide etch with HF acts to remove any oxide residues remaining on the silicon surfaces after that anisotropic etch.

While this oxide etch with HF satisfactorily removes such undesired oxide residues over the silicon surfaces to be contacted by the silicide-forming metal layer, the HF etch also, unfortunately, etches the surface of the oxide spacers, as shown in prior art FIG. 2, resulting in the reduction of both the original width and height of spacers 10 and 12 to the size shown in FIG. 2 and designated therein as spacers 10' and 12'.

This reduction in the height of original spacers 10 and 12 results in the exposure of the upper portions 16 of the sidewalls of polysilicon gate 6, as also shown in FIG. 2. When the metal layer capable of reacting with the silicon to form the silicide is then deposited over the structure and the structure is subsequently heated to cause the metal to react with the silicon to form the metal silicide, the metal silicide, formed by reaction of the metal with the exposed polysilicon portions of gate electrode 6, not only forms over (and in) the top surface of gate electrode 6, but also on (and in) the surface of exposed sidewall portions 16. Thus, as shown in prior art FIG. 3, metal silicide is not only formed on the top of gate electrode 6, as shown at 46 in FIG. 3, but also over the exposed sidewalls 16 of gate electrode 6, as shown at 46a in FIG. 3. This, in turn, reduces the electrical spacing between metal silicide contact 46/46a formed on the gate electrode and metal silicide contacts 40 and 42 respectively formed over source/drain regions 30 and 32, thereby raising the possibility of leakage (or even shorting) between the gate electrode and either the source or drain region (or both). This problem, as well as the problem of total contact area, are further aggravated as line (or gate electrode) and spacing widths become smaller and smaller.

Another approach which has been taken to separate the metal silicide contact on the gate electrode from the metal silicide contacts over the source/drain regions is to provide discontinuities or interruptions in the silicide-forming metal layer deposited over the structure to react with the exposed silicon on the gate electrode and the source/drain regions to form the desired metal silicide contacts. Yen U.S. Pat. No. 4,735,680 shows such a construction wherein a very thin silicon oxide layer is formed over the structure, including the gate electrode and over the substrate. A blanket layer of silicon nitride is then formed over the oxide layer and the silicon nitride layer is then dry etched by an RIE system to form silicon nitride spacers over the oxide layer on the sidewalls of the gate electrode. Then the exposed portions of the very thin oxide layer are etched to expose the top surface of the gate electrode and the substrate surface adjacent the silicon nitride spacers where the source/drain regions will be formed. Some of the oxide between the silicon nitride spacer and the gate electrode, and between the silicon nitride spacer and the silicon substrate, will also be etched, leaving high aspect ratio (depth divided by width) slots between the gate electrode and the silicon nitride spacers, and between the substrate and the silicon nitride spacers. These high aspect ratio slots, said to be greater than 1, cause an interruption in the continuity of the silicide-forming metal subsequently deposited over the structure. As a result, when the structure is subsequently annealed to form the desired metal silicide, there is no lateral growth of metal silicide due to the interruptions of the metal layer over the slots, as shown in FIG. 5 of the patent and in column 3, lines 35–50.

However, while such a construction may reduce the amount of metal silicide formed over the insulation spacer on the sidewalls of the gate electrode, and therefore reduce the incidence of shorting between the metal silicide over the gate electrode and the metal silicide over the source/drain contacts, the interruption of the silicide-forming metal layer at the top of the high aspect ratio slots of Yen can result in an undesirable thinning of the metal silicide formed over the gate electrode at the edges of the electrode. Similarly, the interruption of the silicide-forming metal layer over the slots formed adjacent the source/drain regions can result in a thinning of the metal silicide contact grown over the source/drain regions adjacent those slots, thus effectively reducing the area of the metal silicide contact and possibly increasing the resistance of the contact. This reduction of the contact area becomes more serious as the size of the MOS devices—and the corresponding source/drain contacts—become smaller and smaller.

It would, therefore, be desirable if the gate electrode and source/drain regions of an MOS device could be formed with metal silicide contacts thereon without encountering the problems discussed above.

SUMMARY OF THE INVENTION

In accordance with the invention, metal silicide contacts are formed over the gate electrode and source/drain regions of MOS devices of an integrated circuit structure formed in a silicon substrate by first forming a silicon oxide layer of a given thickness range over exposed portions of the silicon substrate and over exposed surfaces of a previously formed polysilicon gate electrode. Silicon nitride sidewall spacers are then formed over the oxide on the sidewalls of the gate electrode by depositing a silicon nitride layer over the entire structure and then anisotropically etching the silicon nitride layer selectively to the oxide layer. The source/drain regions of the MOS structure are then formed in the silicon substrate adjacent the nitride spacers, and then the structure is contacted with an oxide etch to remove the oxide from the upper surface of the gate electrode and the silicon substrate surfaces over the source/drain regions. The oxide etch system is selected and controlled to form notches or slots, in the exposed edges of the oxide beneath the silicon nitride spacers, having an aspect ratio of 1 or less to ensure subsequent deposition of silicide forming metal in the slots. A layer of such a silicide-forming metal, i.e., capable of reacting with the exposed silicon to form metal silicide contacts, is then deposited over the structure and into the slots or notches between the silicon nitride spacers and the gate electrode and the slots between the silicon nitride spacers and the substrate. The structure is then heated (annealed) causing the metal layer to react with the silicon with which it is in contact to form metal silicide gate and source/drain contacts. Unreacted metal is then removed, leaving a metal silicide gate contact on the upper surface of the polysilicon gate electrode, as well as on those upper portions of the sidewall of the gate electrode exposed by forming the notch in the oxide layer on the sidewall of the electrode, thus avoiding any undesirable thinning of the metal silicide at the edges of the polysilicon gate electrode. Furthermore, the metal silicide forming the source/drain contacts are of enlarged area due to being formed not only over the exposed silicon surfaces of the source/drain regions, but also over those portions of the silicon substrate beneath the nitride spacers exposed by the notches formed in the oxide beneath the nitride spacers and then filled by the deposited layer of silicide-forming metal.

DETAILED DESCRIPTION OF THE INVENTION

Figure 4:
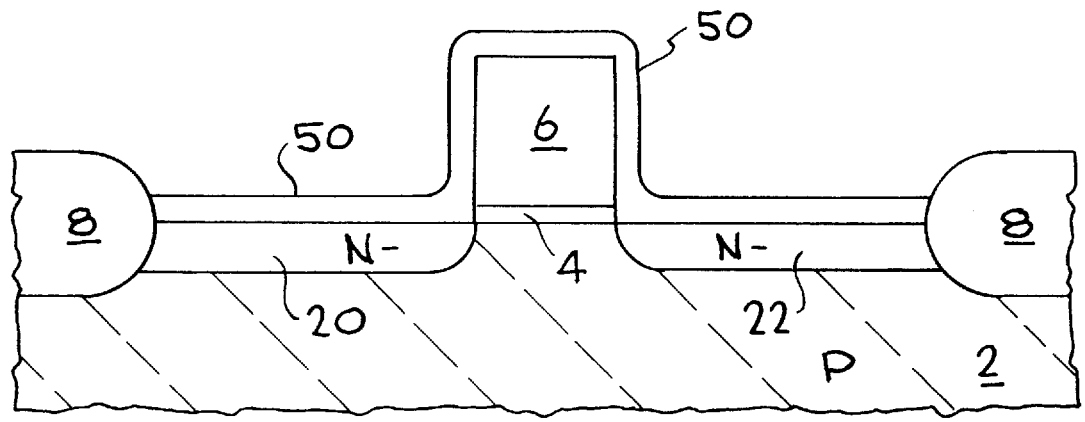
FIG. 4 is a fragmentary vertical side-section view of the formation of an integrated circuit in a silicon substrate with a polysilicon gate electrode formed over a previously formed gate oxide on the substrate and with a silicon oxide layer shown formed over the structure including the gate electrode.

Turning now to FIGS. 4–11, the improved metal silicide contacts of the invention are formed over the gate electrode and source/drain regions of MOS devices in a silicon substrate by first forming a silicon oxide layer 50 over exposed portions of silicon substrate 2 and over exposed surfaces of previously formed polysilicon gate electrode 6, as shown in FIG. 4. Oxide layer 50 has a thickness range of from about 100 Å to about 500 Å and serves several functions. p First of all, oxide layer 50 serves as a buffer layer between the silicon substrate and the silicon nitride spacers which will be subsequently formed thereon to alleviate any stress formation. Oxide layer 50 further serves as an etch stop when etching silicon nitride, which serves to protect the silicon substrate surfaces over the source/drain regions and the polysilicon gate electrode surfaces instead of those silicon surfaces serving as the etch stop as in the prior art. Finally, oxide layer 50 permits the formation of low aspect ratio (an aspect ratio of 1 or less) notches between the silicon nitride spacers and either the gate electrode or the source/drain regions, with the thickness of oxide layer 50 controlling the width of such notches or slots (which, in turn, will affect the aspect ratio of the slots), as will be described below.

Figure 5:
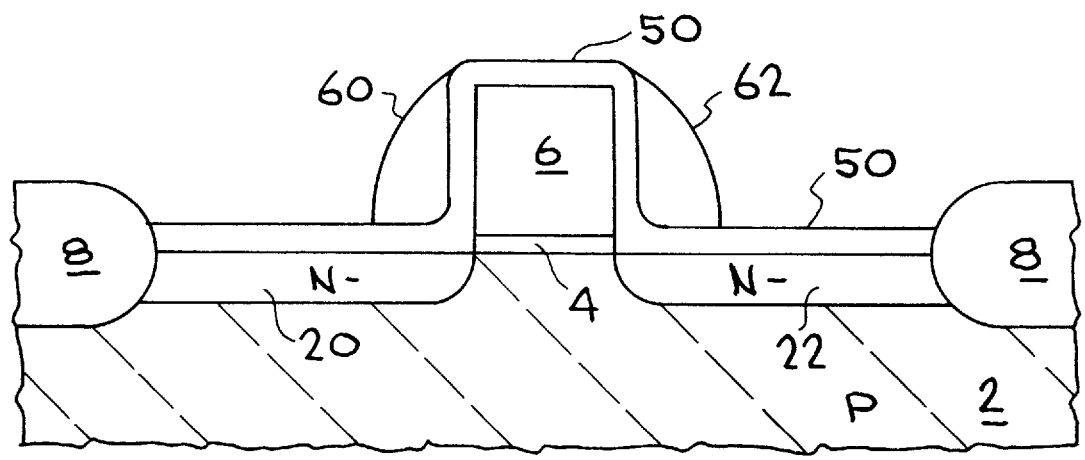
FIG. 5 is a fragmentary vertical side-section view of the structure of FIG. 4 after formation of silicon nitride spacers over the silicon oxide on the sidewalls of the gate electrode.

After the formation of oxide layer 50 (and the formation of LDD regions 20 and 22 prior to the formation of oxide layer 50), silicon nitride sidewall spacers 60 and 62, as shown in FIG. 5, are formed over oxide layer 50 on the sidewalls of the gate electrode by first depositing a silicon nitride layer over oxide layer 50 in a thickness range of from about 500 Å to about 3000 Å. This silicon nitride layer is then anisotropically etched, using an etch system selective to silicon oxide such as, for example, an RIE etch using $SF_6$ and HBr chemistry, with underlying oxide layer 50 acting as the etch stop, resulting in the formation of nitride spacers 60 and 62 shown in FIG. 5.

Figure 6:
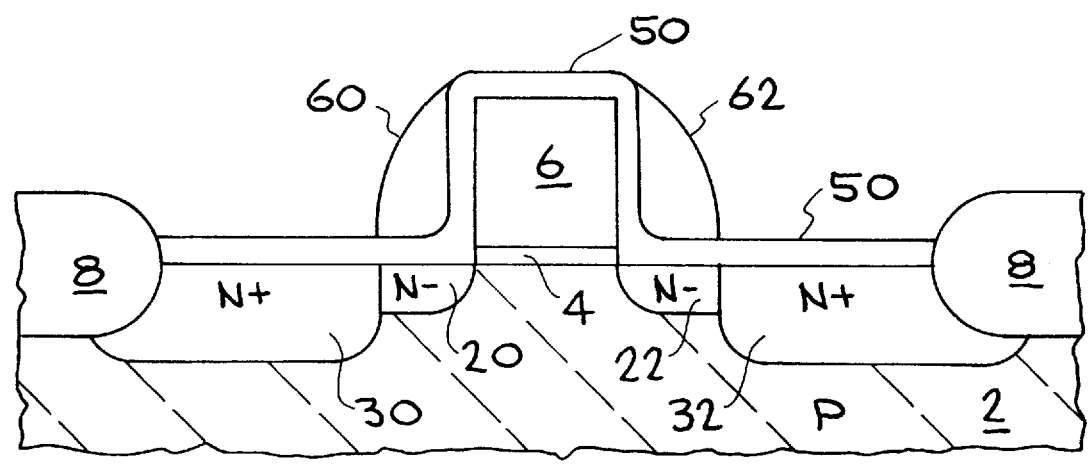
FIG. 6 is a fragmentary vertical side-section view of the structure of FIG. 5 after formation of source/drain regions in the substrate adjacent the nitride spacers.

Source/drain regions 30 and 32 may now be conventionally formed in silicon substrate 2 beneath oxide layer 50 in the area defined by nitride spacers 60 and 62 and field oxide 8, as shown in FIG. 6, by implanting substrate 2 through oxide 50 with boron to form P+ source/drain regions, or with either phosphorus or arsenic to form N+ source/drain regions.

After formation of source/drain regions 30 and 32, exposed portions of oxide layer 50 are removed by contacting the structure with a premetallization oxide wet etch to remove oxide from the upper surface of gate electrode 6 and the substrate surface over newly formed source/drain regions 30 and 32 without damaging nitride spacers 60 and 62. Typically, such a wet etch for selective removal of exposed silicon oxide may comprise a 1 volume % aqueous solution of HF applied at room temperature to the structure for a period ranging from about 30 seconds to about 3 minutes. It will, of course, be appreciated by those skilled in the art that the etch time is related to both the concentration of the etch solution and the temperature of the etch reaction, with higher etchant concentrations and/or higher temperatures resulting in a shorter etch time.

Figure 7:
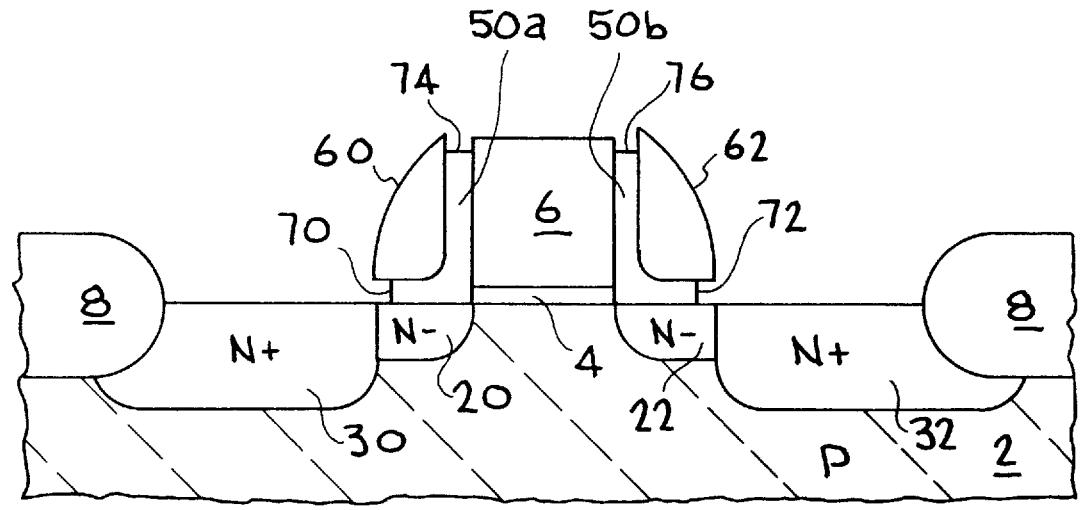
FIG. 7 is a fragmentary vertical side-section view of the structure of FIG. 6 after an oxide etch to remove oxide residues on the upper surface of the gate electrode and from the substrate over the source/drain regions, showing notches formed by the oxide etch beneath the nitride spacers.

As shown in FIG. 7, the oxide etch step not only removes exposed portions of oxide layer 50 over gate electrode 6 and source/drain regions 30 and 32, but also attacks the exposed end edges of oxide layer 50 beneath nitride spacers 60 and 62, both adjacent source/drain regions 30 and 32 and also adjacent the top surface of gate electrode 6, leaving oxide portions 50a and 50b respectively beneath nitride spacers 60 and 62. This attack of the end edges of oxide layer 50 beneath nitride spacers 60 and 62 results in the formation of a notch 70 between nitride spacer 60 and substrate 2, a notch 72 between nitride spacer 62 and substrate 2, a notch 74 between nitride spacer 60 and gate electrode 6, and a notch 76 between nitride spacer 62 and gate electrode 6, as shown in FIG. 7. The depth of such slots, and therefore the aspect ratio of the depth divided by the width of the slots, is controlled by the etch system and the etch time so that the depth does not exceed the width of the slots, i.e., the aspect ratio is unity or less, so that the subsequently deposited silicide-forming metal will penetrate and fill the slot, as shown in FIG. 8.

Figure 8:
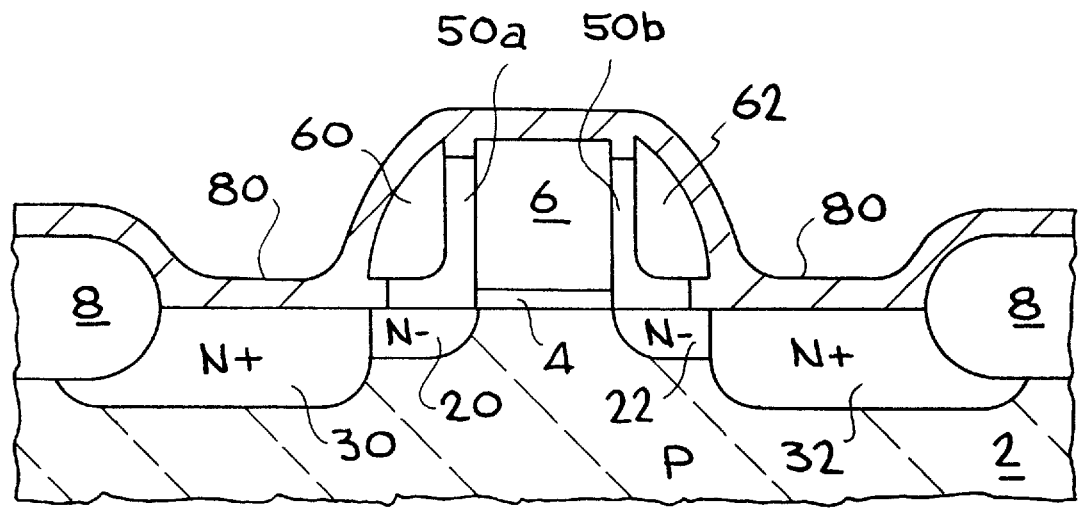
FIG. 8 is a fragmentary vertical side-section view showing the deposition, over the structure of FIG. 7, of a metal capable of reacting with silicon in contact therewith to form a metal silicide.

Referring now to FIG. 8, after the oxide etch step to remove exposed portions of oxide layer 50, and to form notches 70–76, a layer of metal 80 capable of reacting with the exposed silicon to form metal silicide contacts is blanket deposited over the entire structure to a thickness ranging from about 100 Å to about 750 Å, depending upon the desired thickness of the metal silicide contacts to be formed.

It is to be noted that in accordance with the invention, this metal must deposit at least partially into notches 70–76 as well. That is, there cannot be a gap in the metal layer caused by the failure of the metal to enter the slot or notch due to a high aspect ratio of the slot as in the aforesaid Yen patent. Examples of such metals capable of forming metal silicides by reaction with silicon include titanium, cobalt, nickel, platinum, tantalum, and molybdenum.

Figure 9:
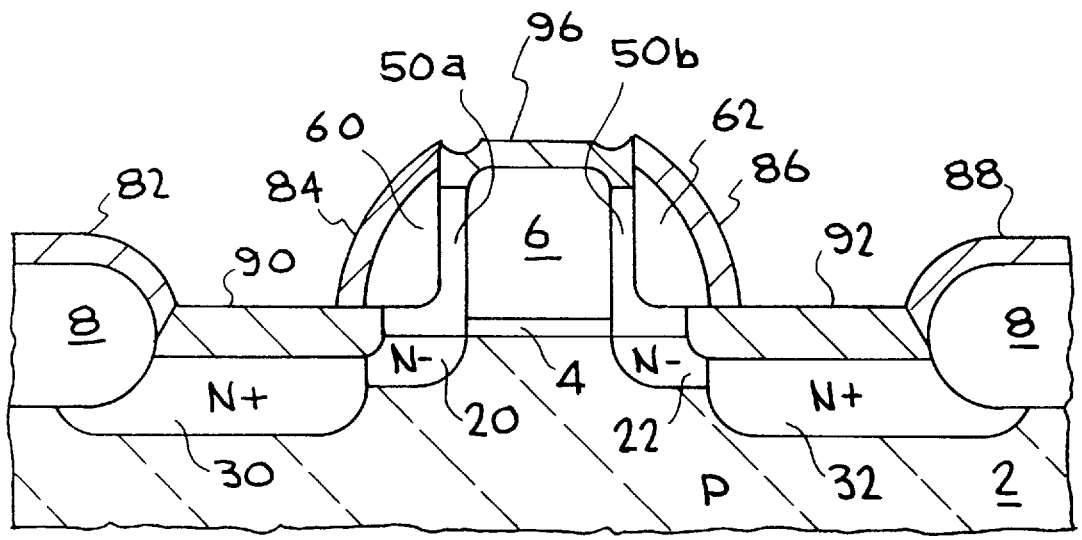
FIG. 9 is a fragmentary vertical side-section view of the structure of FIG. 8 after reaction of the metal with the silicon substrate and the polysilicon gate electrode to form metal silicide over the silicon surfaces in contact with the metal and in the notches formed beneath the silicon nitride spacers.

The structure is then heated to a temperature ranging from about 400° C. to about 700° C. for a period of time ranging from about 10 seconds to about 3 minutes, and preferably from about 30 seconds to about 3 minutes, to cause those portions of metal layer 80 in contact with silicon to react with the silicon to form metal silicide source/drain contacts 90 and 92 and gate electrode metal silicide contact 96, as shown in FIG. 9, leaving unreacted metal portions 82, 84, 86, and 88 over field oxide 8 and silicon nitride spacers 60 and 62.

Figure 1:
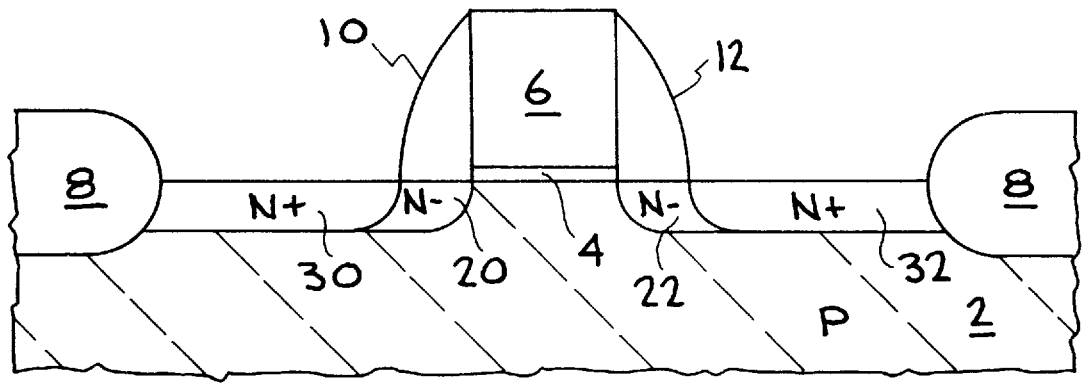
FIG. 1 is a fragmentary vertical side-section view showing the prior art formation of an integrated circuit structure on a silicon substrate with oxide spacers formed on the sidewalls of a polysilicon gate electrode.
Figure 2:
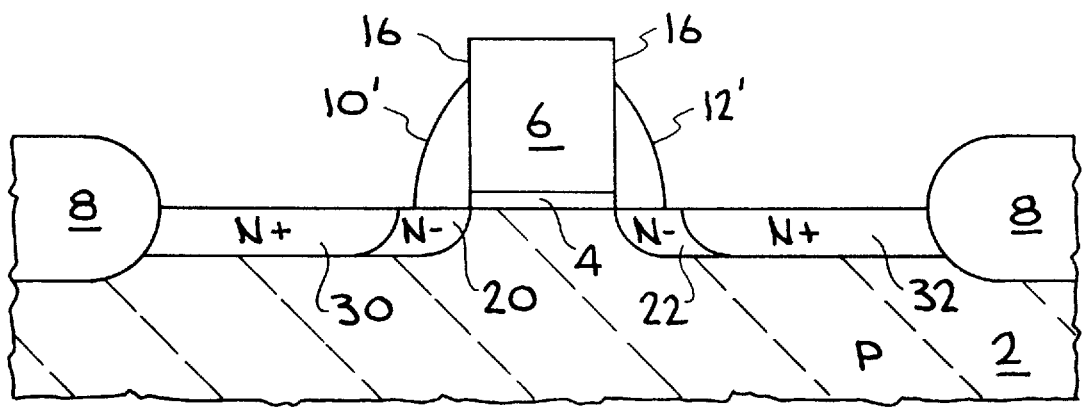
FIG. 2 is a fragmentary vertical side-section view showing the prior art structure of FIG. 1 after a prior art oxide etch to remove oxide from surfaces over source/drain regions in the silicon substrate, and from the upper surface of the polysilicon gate electrode.
Figure 3:
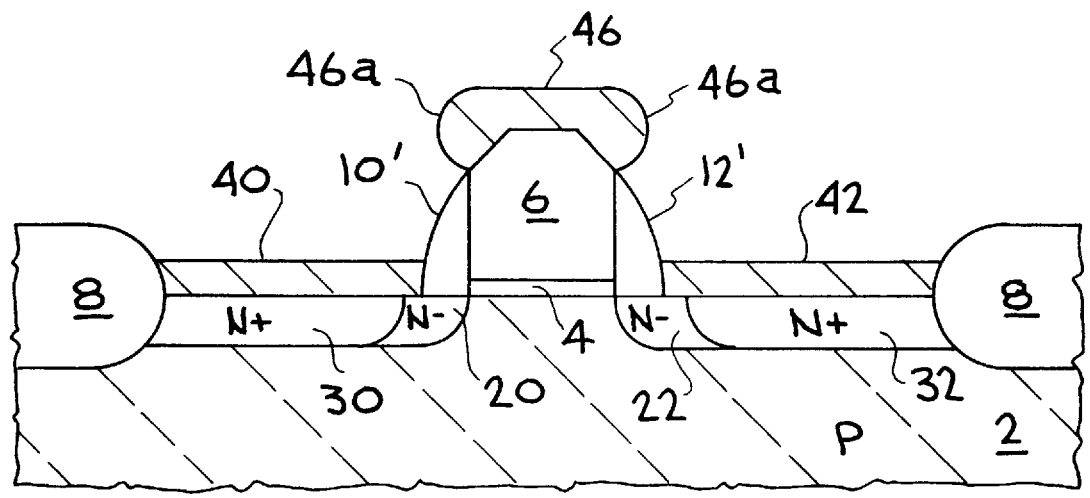
FIG. 3 is a fragmentary vertical side-section view showing the prior art formation of metal silicide over the prior art structure of FIG. 2.
Figure 10:
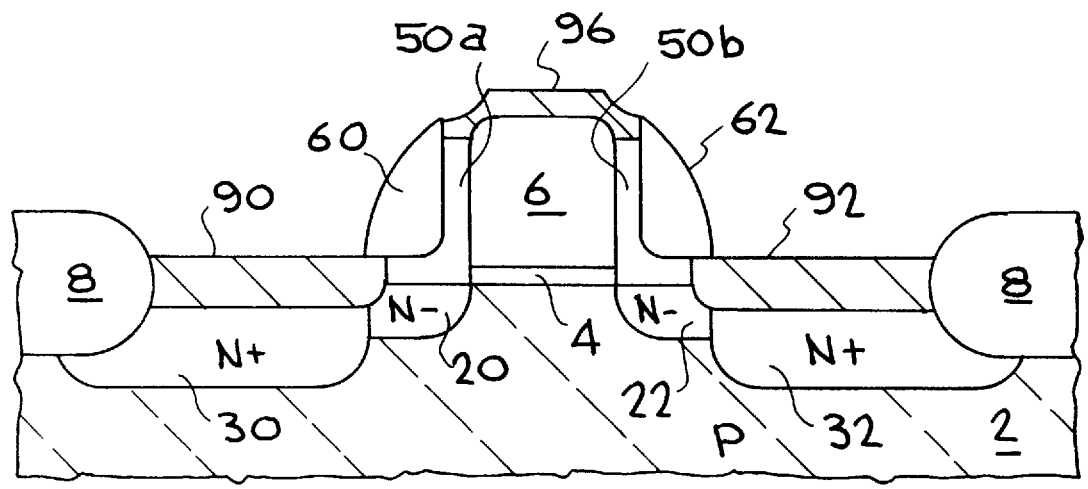
FIG. 10 is a fragmentary vertical side-section view of the structure of FIG. 9 after removal of the unreacted metal.
Figure 11:
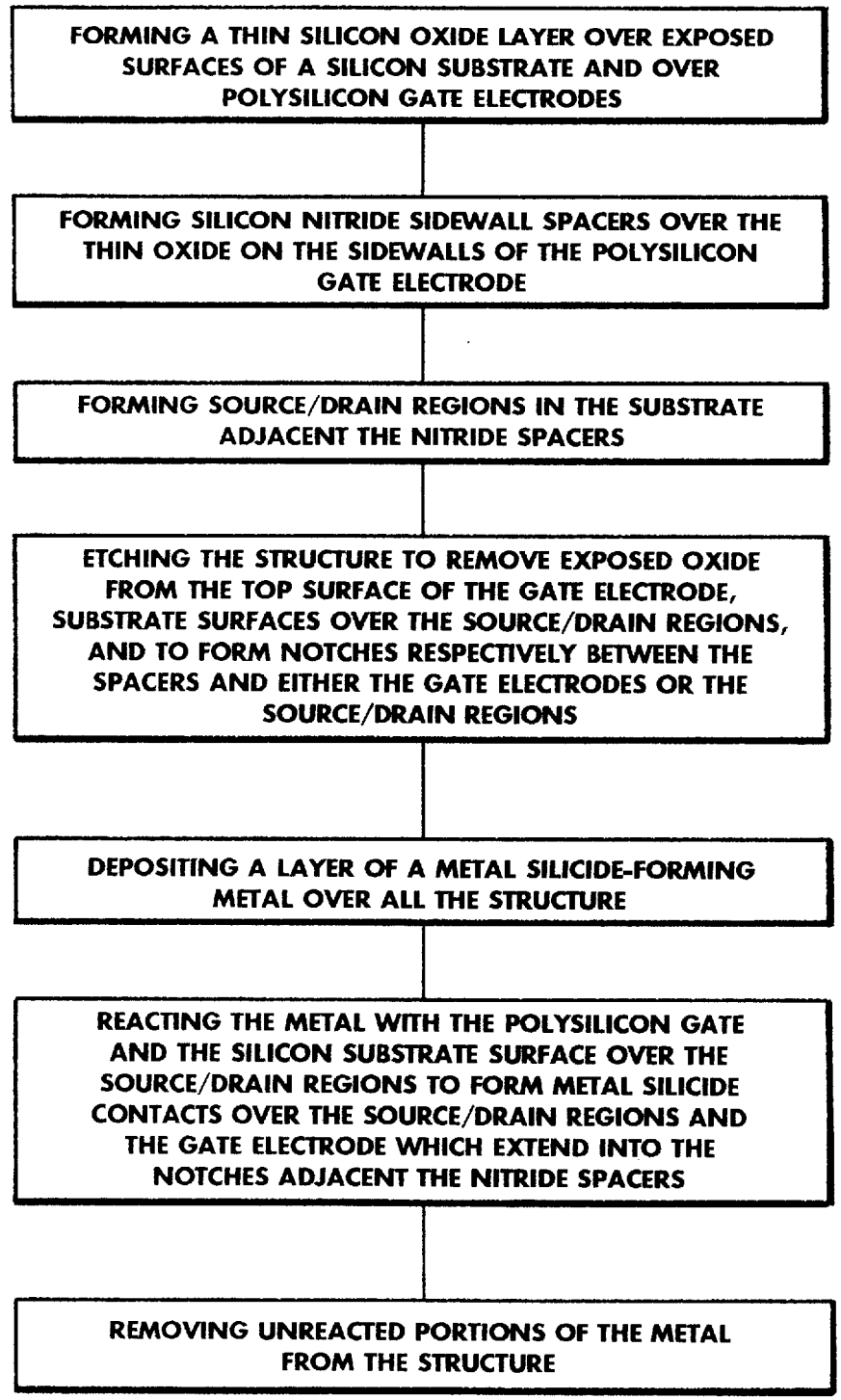
FIG. 11 is a flowsheet illustrating the process of the invention.

As shown in FIG. 10, these unreacted metal segments 82–88 are then removed, leaving metal silicide contact 96 on the upper surface of polysilicon gate electrode 6, as well as those upper portions of the sidewall of gate electrode 6 exposed by forming notches 74 and 76 in oxide layer 50 on the sidewall of gate electrode 6, thereby providing a metal silicide gate contact of more uniform thickness, i.e., without the prior art thinness of the metal silicide adjacent the end edges of the gate electrode. It will be noted from the drawings that this thickening of the metal silicide at the edges of the gate electrode is accomplished, however, without unduly extending the metal silicide down the sidewall of the gate electrode (as in the prior art structure shown in FIG. 3) which could result in leakage between the metal silicide gate contact and the metal silicide source/drain contacts.

Furthermore, as also shown in FIG. 10, metal silicide contacts 90 and 92 are formed over the exposed silicon surfaces of substrate 2 over source/drain regions 30 and 32 and, due to the penetration of the silicide-forming metal into notches 70 and 72, metal silicide contacts 90 and 92 also extend over those portions of silicon substrate 2 beneath nitride spacers 60 and 62 exposed by notches 70 and 72 formed in oxide layer 50 beneath nitride spacers 60 and 62, whereby the total area of metal silicide contacts 90 and 92 is enlarged by virtue of such formation of metal silicide beneath nitride spacers 60 and 62 in notches 70 and 72.

Unreacted metal segments 82–88 may be removed using a conventional etchant selective to the metal silicide, the silicon nitride spacers, and to silicon oxide which will remove unreacted metal and other metal reaction products without, however, attacking the metal silicide, the silicon nitride spacers, or the silicon oxide field oxide. Typically when the metal is titanium, for example, an aqueous etchant mixture of ammonium hydroxide ($NH_4OH$) and hydrogen peroxide ($H_2O_2$) may be used to remove the titanium and titanium nitride without, however, attacking the titanium silicide contacts, the silicon nitride spacers, or the silicon oxide field oxide. If needed, depending upon the metal used to form the silicide, and the type of silicide formed, a further (higher temperature) anneal may now be conducted after removal of the unreacted silicide-forming metal.

Thus, the invention provides improved metal silicide contacts wherein the combination of nitride spacers and an underlying oxide layer of controlled thickness permits the formation of low aspect ratio notches, having aspect ratios of unity or less, in the underlying oxide during the oxide etch used to clean the gate electrode and source/drain substrate surfaces, and these notches permit the formation of metal silicide of more uniform thickness on the upper surface of the gate electrodes without the extension of the metal silicide down the sidewalls surfaces of the gate electrode as in the prior art. Furthermore the notches formed over the substrate beneath the nitride spacers permits enlargement of the substrate area over which the metal silicide source/drain contacts can form, thus permitting shrinkage of the linewidths and pitch of the integrated circuit structure without unduly shrinking the metal silicide source/drain contact area between the gates or lines.

Having thus described the invention what is claimed is:

1. A process for forming improved metal silicide contacts on an MOS device of an integrated circuit structure formed in a silicon substrate comprising the steps of:
   a) forming a silicon oxide layer over said silicon substrate and over said polysilicon gate electrode;
   b) forming silicon nitride sidewall spacers over said oxide on sidewalls of said polysilicon gate electrode;
   c) forming source/drain regions in said silicon substrate adjacent said silicon nitride spacers;
   d) conducting an oxide etch on said structure comprising:
      i) removing said oxide from an upper surface of said gate electrode and a surface over said source/drain regions; and
      ii) forming notches in the exposed edges of said oxide respectively between said silicon nitride spacers and said substrate, and between said silicon nitride spacers and said gate electrode, said notches each having aspect ratios of 1 or less;
   e) depositing over said structure and into said notches a metal layer capable of reacting with exposed silicon to form metal silicide contacts; and
   f) reacting said metal layer with said silicon surfaces with which said metal layer is in contact to form said metal silicide contacts;

whereby a metal silicide gate contact is formed on the upper surface of said polysilicon gate electrode, as well as on those upper portions of said sidewall of said gate electrode exposed by forming said notch in said oxide layer on said sidewall of said gate electrode, and metal silicide source/drain contacts of enlarged area are formed over said silicon substrate surfaces over said source/drain regions and those portions of said silicon substrate beneath said nitride spacers exposed by said notches formed in said oxide layer beneath said nitride spacers.

2. The process of claim 1 including the further step of removing unreacted metal from said structure after said step of forming said metal silicide contacts.

3. The process of claim 1 wherein said step of forming said oxide layer over said silicon substrate and over said polysilicon gate electrode further comprises forming an oxide layer having a thickness ranging from about 100 Å to about 500 Å.

4. The process of claim 1 wherein said step of forming said silicon nitride sidewall spacers over said oxide on sidewalls of said polysilicon gate electrode further comprises the steps of depositing a silicon nitride layer over said entire structure, and then anisotropically etching said silicon nitride layer.

5. The process of claim 4 wherein said step of depositing a silicon nitride layer over said entire structure further comprises depositing from about 500 Å to about 3000 Å of silicon nitride over said structure.

6. The process of claim 1 wherein said step of contacting said structure with an oxide etch further comprises contacting said structure with an aqueous HF solution.

7. The process of claim 6 wherein said step of contacting said structure with an oxide etch comprising an aqueous HF solution further comprises contacting said structure with said aqueous HF solution for a period ranging from about 30 seconds to about 3 minutes.

8. The process of claim 1 wherein said step of depositing over said structure a metal layer capable of reacting with exposed silicon to form metal silicide contacts further comprises depositing said metal to a thickness ranging from about 100 Å to about 750 Å.

9. The process of claim 8 wherein said step of depositing over said structure a metal layer capable of reacting with exposed silicon to form metal silicide contacts further comprises depositing a metal layer selected from the group consisting of titanium, cobalt, tungsten, tantalum, niobium, and molybdenum.

10. The process of claim 8 wherein said step of depositing over said structure a metal layer capable of reacting with exposed silicon to form metal silicide contacts further comprises depositing a metal layer selected from the group consisting of titanium and cobalt.

11. The process of claim 1 wherein said step of reacting said metal layer with said silicon surfaces to form said metal silicide contacts further comprises reacting said metal layer with said silicon surfaces at a temperature ranging from about 400° C. to about 700° C.

12. The process of claim 1 wherein said step of reacting said metal layer with said silicon surfaces to form said metal silicide contacts further comprises reacting said metal layer with said silicon surfaces for a period of time ranging from about 10 seconds to about 3 minutes to form said metal silicide contacts.

13. The process of claim 4 wherein said step of anisotropically etching said silicon nitride layer to form said silicon nitride spacers further comprises subjecting said silicon nitride layer to a reactive ion etch (RIE).

14. The process of claim 13 wherein said reactive ion etch (RIE) is carried out using an etch system selective to silicon oxide.

15. The process of claim 14 wherein said reactive ion etch (RIE) etch system selective to silicon oxide comprises a mixture of $SF_6$ and HBr.

16. A process for forming improved metal silicide contacts on an MOS device of an integrated circuit structure formed in a silicon substrate comprising the steps of:
   a) forming a silicon oxide layer of from about 100 Å to about 500 Å over exposed portions of said silicon substrate and over exposed portions of said polysilicon gate electrode;
   b) forming silicon nitride sidewall spacers over said oxide on sidewalls of said polysilicon gate electrode by the steps of:
      i) depositing a silicon nitride layer of from about 500 Å to about 3000 Å over the entire structure; and
      ii) then anisotropically etching said silicon nitride layer;
   c) forming source/drain regions in said silicon substrate adjacent said silicon nitride spacers;
   d) conducting an oxide etch on said structure comprising:
      i) removing said oxide from an upper surface of said gate electrode and a surface over said source/drain regions; and
      ii) forming notches in the exposed edges of said oxide respectively between said silicon nitride spacers and said substrate, and between said silicon nitride spacers and said gate electrode, said notches each having an aspect ratio of 1 or less;

e) depositing over said structure and into said notches a metal layer capable of reacting with exposed silicon to form metal silicide contacts;

f) reacting said metal layer with said silicon surfaces with which said metal layer is in contact to form said metal silicide contacts; and g) removing unreacted metal from said structure after said step of forming said metal silicide contacts;

whereby a metal silicide gate contact is formed on the upper surface of said polysilicon gate electrode, as well as on those upper portions of said sidewall of said gate electrode exposed by forming said notch in said oxide layer on said sidewall of said gate electrode, and metal silicide source/drain contacts of enlarged area are formed over said silicon substrate surfaces over said source/drain regions and those portions of said silicon substrate beneath said nitride pacers exposed by said notches formed in said oxide layer beneath said nitride spacers.

* * * * *